United States Patent [19]

Arledge et al.

[11] Patent Number: 5,576,052
[45] Date of Patent: Nov. 19, 1996

[54] METHOD OF METALLIZING HIGH ASPECT RATIO APERTURES

[75] Inventors: John K. Arledge, Ft. Lauderdale; Thomas J. Swirbel, Davie; Joaquin Barreto, Coral Springs, all of Fla.

[73] Assignee: Motorola, Inc., Schaumburg, Ill.

[21] Appl. No.: 635,822

[22] Filed: Apr. 22, 1996

[51] Int. Cl.⁶ ...................................... B05D 5/12
[52] U.S. Cl. .................. 427/98; 204/192.17; 427/99; 427/124; 427/125; 427/237; 427/238; 427/250; 427/258; 427/294; 427/299; 427/406; 427/443.1
[58] Field of Search ............................ 427/98, 125, 99, 427/237, 124, 238, 250, 258, 294, 299, 406, 443.1; 204/192.17

[56] References Cited

U.S. PATENT DOCUMENTS 4,054,483  10/1977  Peiffer ........................ 156/632
4,521,280   6/1985  Bahrle et al. ..................... 204/15

*Primary Examiner*—Bernard Pianalto
*Attorney, Agent, or Firm*—Dale W. Dorinski

[57] ABSTRACT

A method of manufacturing high aspect ratio plated through holes in a circuit carrying substrate. High aspect ratio apertures or holes (16) are formed in a substrate (10). A thin film of copper (20) is sputtered onto the substrate and in the apertures that a macroscopically discontinuous copper film (26) is formed on part of the aperture walls. The macroscopically discontinuous copper film is substantially thinner than the copper film that is deposited on the surface. A catalytic copper coating (30) is plated directly on the vacuum deposited thin film of copper by electroless copper plating in a manner sufficient to form a macroscopically continuous copper layer on the aperture walls.

13 Claims, 2 Drawing Sheets

5,576,052

METHOD OF METALLIZING HIGH ASPECT RATIO APERTURES

TECHNICAL FIELD

This invention relates in general to a method of manufacturing electrically conductive high aspect ratio holes in a substrate carrying printed circuits on both sides.

BACKGROUND

Printed circuit boards (PCB) are manufactured using a large number of complex steps and processes. Basically, the PCB is made by laminating thin sublayers together. Copper clad laminates are normally used to make the etched circuitry layers, and are bonded together with prepreg or bonding sheets. The resulting single strong panel may optionally have internal etched copper layers centrally embedded in the resin. The panel is then drilled, and the drilled holes are metallized to provide the electrical connections between the inner and the outer layers. The outer two layers are then etched to make the circuitry patterns. The resulting structure is the well-known plated through hole, shown in FIG. 1. Note that the interior layers are connected to the metallized hole, which also further connects them to the exterior two layers.

Artisans have sought to use ever-decreasing hole diameters in order to reduce the real estate on the board surface. However, it is costly to produce small diameter plated through holes with guaranteed electrical continuity, because plating metal in these tiny holes is not a reproducible process. The quality of the connection between the hole plating and the internal layers can only be checked by destructive microsectioning. One alternative to small-hole PCB technology is multilayer ceramic. The substrates for these modules have many (up to 23) layers, and each layer begins as a part of a continuous cast sheet of ceramic material, cut into pieces 175 mm square, then punched with holes so that electrical connections could later be made between layers. Conductive paste is then extruded onto the green sheets through metal masks, forming a wiring pattern unique to a given layer. Stacks of these sheets, with the required configurations of conducting line and insulating layers, layer-to-layer connections, and reference and power planes, were laminated together and trimmed to form individual modules, which were then fired in a furnace to harden the ceramic. The resulting small diameter via contains a conductive media that forms the side to side connection.

Clearly, a need exists for a better, more efficient way to create small diameter plated through holes.

DETAILED DESCRIPTION OF THE PREFERRED EMBODIMENT

A method for providing conductive through holes to make electrical connection as required from the circuit on the front side of a PCB to the circuit on the back side is disclosed. This method is particularly appropriate to the use of additive circuit manufacturing methods starting with vacuum deposited copper as the base layer for electroplating. Very thin base metal layers are a necessity for fabrication of high density circuits, lines less than 75 micrometers in width with spaces less than 75 micrometer between the lines, for example. Vacuum deposition of this thin metal layer, rather than conventional electroless copper plating, might be appropriate in many situations. For example, DC sputtering results in improved metal adhesion on certain substrate materials.

Figure 1:
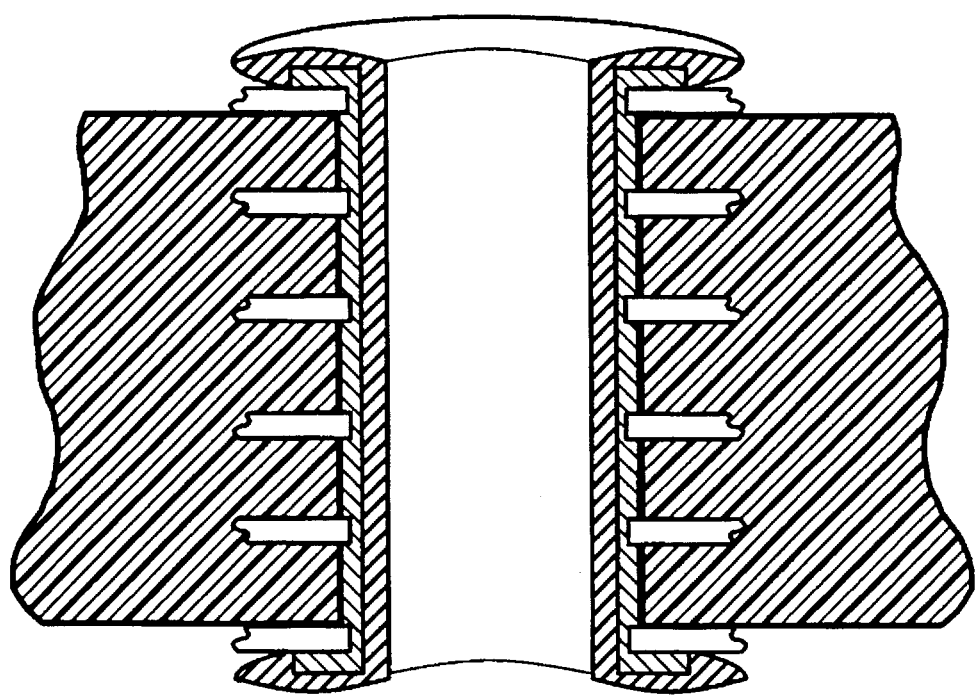
FIG. 1 is a cross sectional view of a plated through hole as practiced in the prior art.
Figure 2:
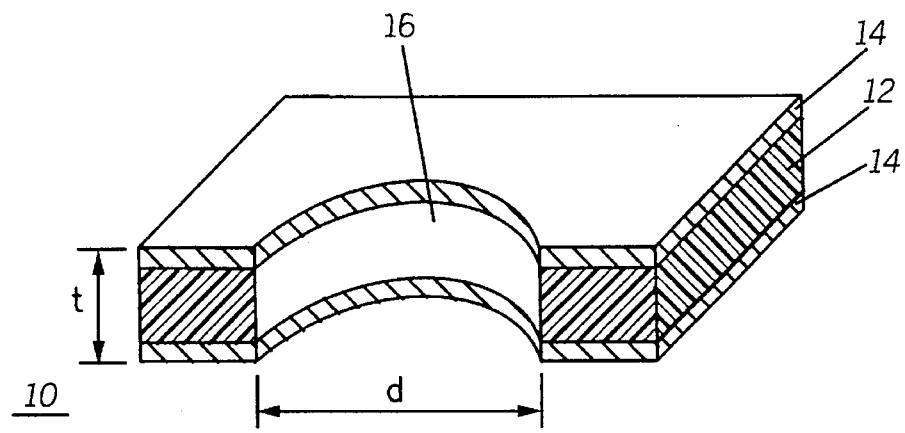
FIGS. 2, 3 and 4 are cut-away isometric views showing the various stages of the method of manufacturing high aspect ratio holes in accordance with the invention.

Referring now to FIG. 2, a substrate 10 is first provided. The substrate is typically a fiberglass reinforced organic material such as the well-known FR-4 epoxy laminate. Other types of resins can also be substituted, such as polyimide, polytetrafluoroethylene, polyester, polyetherimide, etc. The substrate 10 typically has a center core 12, made of the fiberglass reinforced organic material that is clad on one or both sides with a layer of copper 14. To make connection between the circuit traces which will subsequently be created on opposite sides of the clad substrate, a hole 16 is drilled through the substrate 10 perpendicular to the two opposing faces. The present invention is particularly applicable to the case where the substrate thickness (t) is substantially greater than the diameter (d) of the drilled holes (although, for clarity, the diameter (d) is shown in greatly exaggerated scale in the drawing figures). This condition is known as 'high aspect ratio', and in this context typically is greater than 3/1, where the ratio is defined as the ratio of the substrate thickness to diameter (t/d) of the hole. Typically, high aspect ratio holes for which the invention is applicable are in the range of 5/1 to 15/1, and have hole diameters less than 0.5 millimeters.

Figure 3:
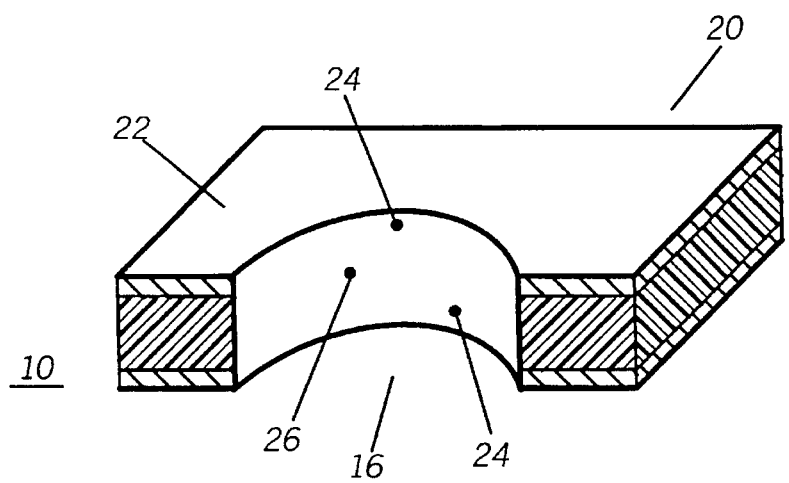

After the holes have been drilled in the substrate, a very thin layer of copper 20 is applied to the substrate by vacuum deposition (FIG. 3). The preferred method of vacuum deposition is DC sputtering, though other methods such as evaporation and RF sputtering can be employed. This vacuum deposited layer forms on all exposed exterior surfaces of the substrate, including the two faces, the edges, and on the interior walls of the drilled hole 16. In an alternate embodiment, a thin adhesion promoting layer such as 500 Å of chromium might first be sputtered, followed by the copper layer. In any event, the copper layer is applied so that the thickness on the face of the substrate is in the range of 4000 Å to 20,000 Å, with 5000 Å to 15,000 Å being preferred. Sputtering copper at this thickness results in a macroscopically continuous conducting layer on both faces of the substrate, while a macroscopically discontinuous layer of copper is deposited in the high aspect ratio through holes. We postulate that this is because the drilled holes 16 are very narrow when compared to the depth of the hole, and it is difficult for a significant amount of copper atoms to find their way deep into the interior of the hole. However, due to the statistics of the sputtering process, some small amount of copper atoms apparently are deposited in the far interior of the high aspect ratio hole walls, forming a discontinuous island type of structure, the islands acting as nucleation sites that can later be used to advantage in a plating process. Due to the very small diameter (high aspect ratio) of the drilled holes, sputtering additional copper thickness has not been found to substantially improve the continuity of the film deposited inside the high aspect ratio holes. To reiterate, the vacuum deposition process results in a thin film of about 5000 Å to 15,000 Å of copper deposited on the face 22 of the substrate and on the walls of the drilled hole walls near the outer edges 24, but the measured copper thickness continues to decrease as one travels along the hole wall towards the center 26 of the substrate, until the copper film deposited in this area changes from macroscopically continuous to macroscopically discontinuous. Those skilled in the art have known that it not possible to sputter metal deep into high aspect ratio apertures, because the metal does not reach the interior, and thus they have avoided using high aspect ratio holes. However, we have discovered that even though the copper cannot be visually detected, and even though electrical probing shows that the hole is not electrically continuous from one side of the substrate to the other, some small (previously considered to be insignificant or non-existent) amount of metal is apparently deposited in the deep interior wall 26 of the hole. This small deposition apparently forms what we refer to as a 'macroscopically discontinuous' film less than 100 Angstroms thick, which serves as an anchor for metal deposited by conventional plating processes in a later step.

Figure 4:
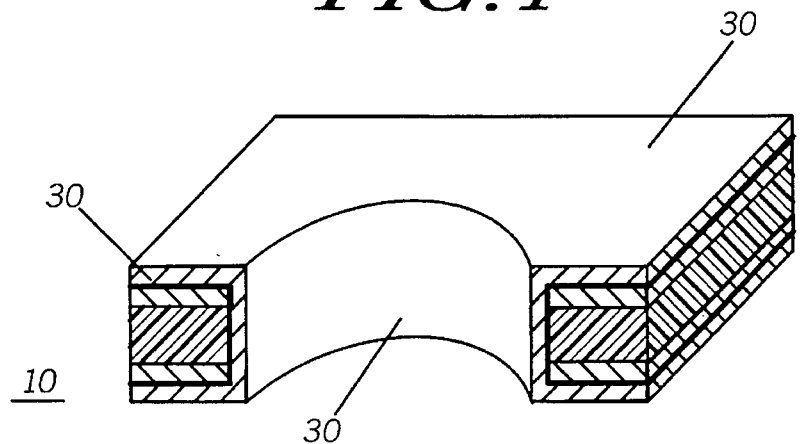

Referring now to FIG. 4, after vacuum deposition, the substrates are immersed in an electroless copper plating bath. This bath deposits additional copper 30 on the sputtered surfaces and in the holes using an autocatalytic reaction, and the vacuum deposited copper serves as the 'seed' layer for the electroless deposition. With most standard electroless bath chemistries, 5 to 10 minutes of immersion is sufficient to achieve complete continuity of the through holes from front to back. One type of plating bath found to be suitable is an alkaline solution of copper, formaldehyde and EDTA. Typically, one also finds trace quantities of palladium, tin or reaction byproducts of palladium, tin or copper in these types of plating baths. It should be noted that only one wet chemistry bath is required for the plating operation in the instant invention, whereas, in the prior art, 5 or 6 baths are typically used to catalyze and plate electroless copper on bare (i.e. no metal) substrate surfaces.

The PCB can then be completed using standard additive methods of photodefining the circuit, electroplating the circuit on the surface and in the holes, and then etching the sputtered metal from the two faces to separate the circuit traces as desired. These additional steps are well known to those skilled in the art of PCB and hybrid circuit manufacturing, and do not need to be further elaborated upon here. Obvious variations of these additional steps are considered to fall within the scope and spirit of the invention, and the invention is not intended to be limited except as by the claims.

In summary, we have discovered that numerous conventional steps (as practiced in the prior art) of preparing the surface of a drilled hole in a PCB for electroless plating can be eliminated by a single step of properly sputtering a layer of copper or chrome and copper. The sputtered copper forms a macroscopically discontinuous film on the interior walls of the high aspect ratio hole, deep within the hole. This film is then used as a novel seed layer for subsequent electroless copper plating. The electroless copper catalytically plates on this seed layer, forming a usable layer of plated copper in the high aspect ratio hole. Thus, holes with aspect ratios greater than previously attainable can now be made. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of manufacturing a circuit carrying substrate, comprising the following steps in the order named:
   a) providing a substrate having an aperture therein, the aperture having walls and a high aspect ratio;
   b) vacuum depositing a thin film of copper on a major surface of the substrate and in the aperture, in a manner sufficient to form a macroscopically discontinuous copper film on the aperture walls, said macroscopically discontinuous copper film being substantially thinner than the thin film of copper deposited on the major surface; and
   c) depositing a catalytic copper coating directly on the vacuum deposited thin film of copper by immersing the substrate in an electroless copper plating bath in a manner sufficient to form a macroscopically continuous copper layer on the aperture walls.

2. The method as described in claim 1, wherein the step of vacuum depositing comprises sputtering or evaporation.

3. The method as described in claim 1, wherein the electroless copper plating bath comprises an alkaline solution of copper, formaldehyde and EDTA.

4. The method as described in claim 1, wherein the electroless copper plating bath contains trace quantities of palladium, tin or reaction byproducts of palladium, tin or copper.

5. The method as described in claim 1, wherein the high aspect ratio is greater than 3/1 and aperture diameter is less than 0.5 millimeters.

6. The method as described in claim 1, wherein the high aspect ratio is greater than 5/1.

7. The method as described in claim 1, wherein the thin film of copper on the major surface is between 4,000 and 20,000 Angstroms thick.

8. The method as described in claim 1, wherein the macroscopically discontinuous copper film on the aperture walls is less than 100 Angstroms thick.

9. The method as described in claim 1, wherein the macroscopically discontinuous copper film is a discontinuous island structure.

10. The method as described in claim 1, wherein the substrate is a printed circuit board.

11. A method of metallizing high aspect ratio apertures in a printed circuit board, comprising the following steps in the order named:
    a) providing a printed circuit laminate having apertures therein, the apertures having sidewalls and an aspect ratio greater than 4/1;
    b) sputtering a thin film of copper on a major surface of the printed circuit laminate and in the apertures, such that the thin film of copper deposited on the major surface is between 4,000 and 20,000 Angstroms thick and such that the thin film of copper deposited on the aperture sidewalls is less than 100 Angstroms thick and macroscopically discontinuous; and
    c) depositing a layer of electroless copper on the thin film of copper by immersing the printed circuit laminate in an auto-catalytic copper plating bath until a macroscopically continuous layer of copper is formed on the aperture sidewalls.

12. The method as described in claim 11, wherein the auto-catalytic copper plating bath comprises an alkaline solution of copper, formaldehyde and EDTA.

13. The method as described in claim 11, wherein the auto-catalytic copper plating bath contains trace quantities of palladium, tin or reaction byproducts of palladium, tin or copper.

* * * * *